United States Patent
Christodoulou et al.

(10) Patent No.: US 12,265,145 B2
(45) Date of Patent: Apr. 1, 2025

(54) SYSTEMS AND METHODS OF DEEP LEARNING FOR LARGE-SCALE DYNAMIC MAGNETIC RESONANCE IMAGE RECONSTRUCTION

(71) Applicant: Cedars-Sinai Medical Center, Los Angeles, CA (US)

(72) Inventors: Anthony Christodoulou, Los Angeles, CA (US); Debiao Li, Los Angeles, CA (US); Yuhua Chen, Los Angeles, CA (US)

(73) Assignee: CEDARS-SINAI MEDICAL CENTER, Los Angeles, CA (US)

( * ) Notice: Subject to any disclaimer, the term of this patent is extended or adjusted under 35 U.S.C. 154(b) by 398 days.

(21) Appl. No.: 17/642,016

(22) PCT Filed: Sep. 10, 2020

(86) PCT No.: PCT/US2020/050247
§ 371 (c)(1),
(2) Date: Mar. 10, 2022

(87) PCT Pub. No.: WO2021/050765
PCT Pub. Date: Mar. 18, 2021

(65) Prior Publication Data
US 2023/0194640 A1 Jun. 22, 2023

Related U.S. Application Data

(60) Provisional application No. 62/900,279, filed on Sep. 13, 2019.

(51) Int. Cl.
*G01R 33/56* (2006.01)
*G01R 33/483* (2006.01)
*G06N 3/08* (2023.01)

(52) U.S. Cl.
CPC ....... *G01R 33/5608* (2013.01); *G01R 33/483* (2013.01); *G06N 3/08* (2013.01)

(58) Field of Classification Search
CPC ................................ G01R 33/483; G06N 3/08
See application file for complete search history.

(56) References Cited

U.S. PATENT DOCUMENTS

| 5,778,152 A | 7/1998 | Oki |
| 7,194,365 B1 | 3/2007 | Sonntag |

(Continued)

FOREIGN PATENT DOCUMENTS

| CN | 103837848 A | 6/2019 |
| CN | 109903259 A | 10/2023 |

OTHER PUBLICATIONS

Sandino, Christopher M., Frank Ong, and Shreyas S. Vasanawala. "Deep subspace learning: Enhancing speed and scalability of deep learning-based reconstruction of dynamic imaging data." Proc Int Soc Magn Reson Med. Jul. 24, 2020. (Year: 2020).*

(Continued)

*Primary Examiner* — David Perlman
(74) *Attorney, Agent, or Firm* — NIXON PEABODY LLP

(57) ABSTRACT

A method for performing magnetic resonance imaging on a subject comprises obtaining undersampled imaging data, extracting one or more temporal basis functions from the imaging data, extracting one or more preliminary spatial weighting functions from the imaging data, inputting the one or more preliminary spatial weighting functions into a neural network to produce one or more final spatial weighting functions, and multiplying the one or more final spatial weighting functions by the one or more temporal basis functions to generate an image sequence. Each of the temporal basis functions corresponds to at least one time-varying dimension of the subject. Each of the preliminary spatial weighting functions corresponds to a spatially-vary- (Continued)

ing dimension of the subject. Each of the final spatial weighting functions is an artifact-free estimation of the one of the one or more preliminary spatial weighting functions.

20 Claims, 8 Drawing Sheets

(56) References Cited

U.S. PATENT DOCUMENTS

| | | | |
|---|---|---|---|
| 11,782,111 | B2 | 10/2023 | Qu |
| 2005/0020897 | A1 | 1/2005 | Fuderer |
| 2006/0186941 | A1 | 8/2006 | Pruessmann |
| 2008/0100292 | A1 | 5/2008 | Hancu |
| 2008/0125643 | A1 | 5/2008 | Huisman |
| 2011/0044524 | A1 | 2/2011 | Wang |
| 2014/0219531 | A1 | 8/2014 | Epstein |
| 2016/0202336 | A1 | 7/2016 | Liang |
| 2019/0128989 | A1* | 5/2019 | Braun .................... G06N 5/046 |
| 2020/0103483 | A1* | 4/2020 | Hardy ................ G01R 33/5608 |
| 2020/0294287 | A1* | 9/2020 | Schlemper ................ G06T 3/60 |
| 2020/0319285 | A1* | 10/2020 | Koerzdoerfer ....... G01R 33/543 |

OTHER PUBLICATIONS

Nakarmi, U., Wang, Y., Lyu, J., Liang, D., & Ying, L. (2017). A kernel-based low-rank (KLR) model for low-dimensional manifold recovery in highly accelerated dynamic MRI. IEEE transactions on medical imaging, 36(11), 2297-2307. (Year: 2017).*
Chen et al. "Convolutional Recurrent Neural Networks for Dynamic MR Image Reconstruction", IEEE Transactions on Medical Imaging, vol. 38, No. 1, (Jan. 1, 2019), pp. 280-290.
Oksuz et al. "Detection and Correction of Cardiac MR Motion Artefacts during Reconstruction from k-space", arxiv.org, Cornell University Library, 201 Olin Library Cornell University Ithaca, NY 14853, Jun. 12, 2019.
Chen et al. "Deep Learning Within Temporal Feature Spaces for Large-Scale Dynamic MR Image Reconstruction: Application to 5-D Cardiac MR Multitasking", Oct. 10, 2019, 16th European Conference—Computer Vision—ECCV 2020, Cornell University Library, 201 Olin Library Cornell University Ithaca, NY 14853, pp. 495-504.
Schlemper et al. "A Deep Cascade of Convolutional Neural Networks for Dynamic MR Image Reconstruction", IEEE Trans Med Imaging 37, 491-503 (2018).
Qin et al. "Convolutional Recurrent Neural Networks for Dynamic MR Image Reconstruction", IEEE Trans Med Imaging 38, 280-290 (2019).
Biswas et al. "Dynamic MRI using model-based deep learning and SToRM priors: MoDL-SToRM", Magn Reson Med (2019).
Feng et al. "XD-GRASP: Golden-angle radial MRI with reconstruction of extra motion-state dimensions using compressed sensing", Magn Reson Med 75, 775-788 (2016).
Cheng et al. "Comprehensive multi-dimensional MRI for the simultaneous assessment of cardiopulmonary anatomy and physiology", Sci Rep 7, 5330 (2017).
Christodoulou et al. "Magnetic resonance multitasking for motion-resolved quantitative cardiovascular imaging", Nature Biomed Eng 2, 215-226 (2018).
Liang "Spatiotemporal imaging with partially separable functions", Proc IEEE Int Symp Biomed Imaging, pp. 988-991 (2007).
Lingala et al. "Accelerated dynamic MRI exploiting sparsity and low-rank structure: k-t SLR", IEEE Trans Med Imaging 30, 1042-1054 (2011).
Zhao et al. "Image reconstruction from highly undersampled (k,t)-space data with joint partial separability and sparsity constraints", IEEE Trans Med Imaging 31, 1809-1820 (2012).
Poddar et al. "Dynamic MRI Using SmooThness Regularization on Manifolds (SToRM)", IEEE Trans Med Imaging 35, 1106-1115 (2016).
Bengio et al. "Representation learning: A review and new perspectives", IEEE Trans Pattern Anal Mach Intell 35, 1798-1828 (2013).
Shaw et al. "Free-breathing, non-ECG, continuous myocardial T1 mapping with cardiovascular magnetic resonance Multitasking", Magn Reson Med 81, 2450-2463 (2019).
Chen et al. "Efficient and accurate MRI super-resolution using a generative adversarial network and 3D multi-Level densely connected network", In: MICCAI, pp. 91-99. Springer, (2017).
Jégou et al. "The one hundred layers tiramisu: Fully convolutional densenets for semantic segmentation", Proceedings of the IEEE Conference on Computer Vision and Pattern Recognition Workshops, pp. 11-19. (2017).
Clevert et al. "Fast and accurate deep network learning by exponential linear units (Elus)", arXiv preprint arXiv:1511.07289 (2015).
Kali et al. "Native T1 mapping by 3-T CMR imaging for characterization of chronic myocardial infarctions." JACC: Cardiovascular Imaging 8, No. 9 1019-1030 (2015).
Extended Europan Search Report in European Patent Application No. 20863427.9, mailed Aug. 21, 2023 (9 pages).
Muckley, M. J. et al., "Training a Neural Network for Gibbs and Noise Removal in Diffusion MRI," Magnetic Resonance in Medicine, 85(1): 413-428, Jul. 2020. https://arxiv.org/abs/1905.04176.
International Search Report and Written Opinion in International Patent Application No. PCT/US2020/050247, mailed Jan. 7, 2021 (14 pages).
Weng Zhuo et al., "Based on k-space acceleration magnetic resonance imaging technology", A Journal of Chinese Biomedical Engineering, Issue 5, Oct. 20, 2010, pp. 785-792 (8 pp.).

* cited by examiner

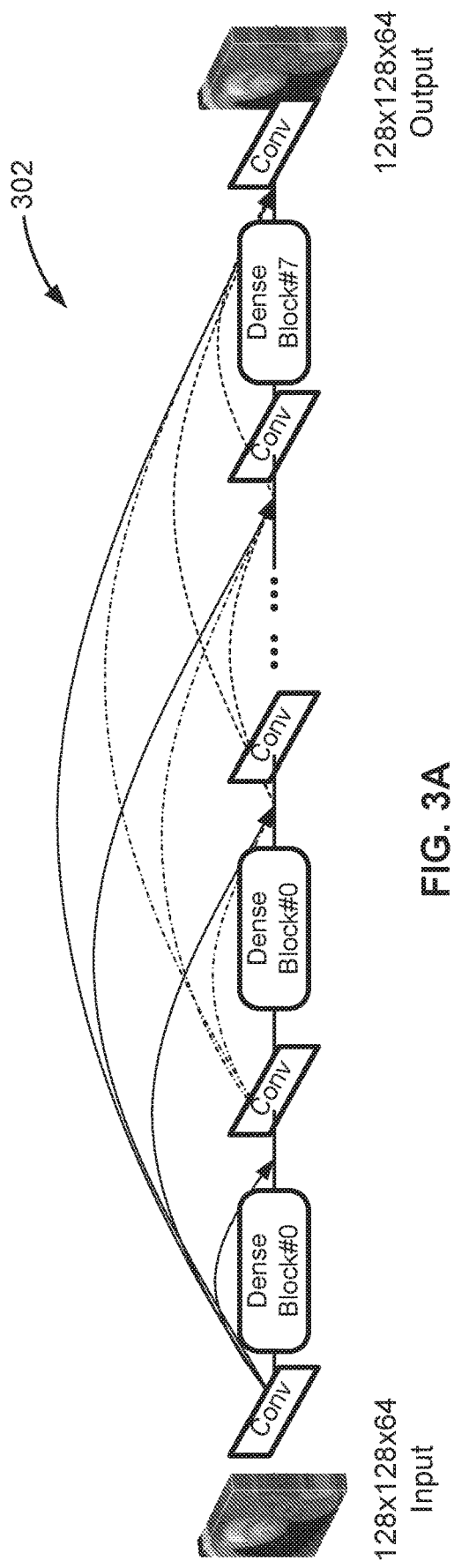
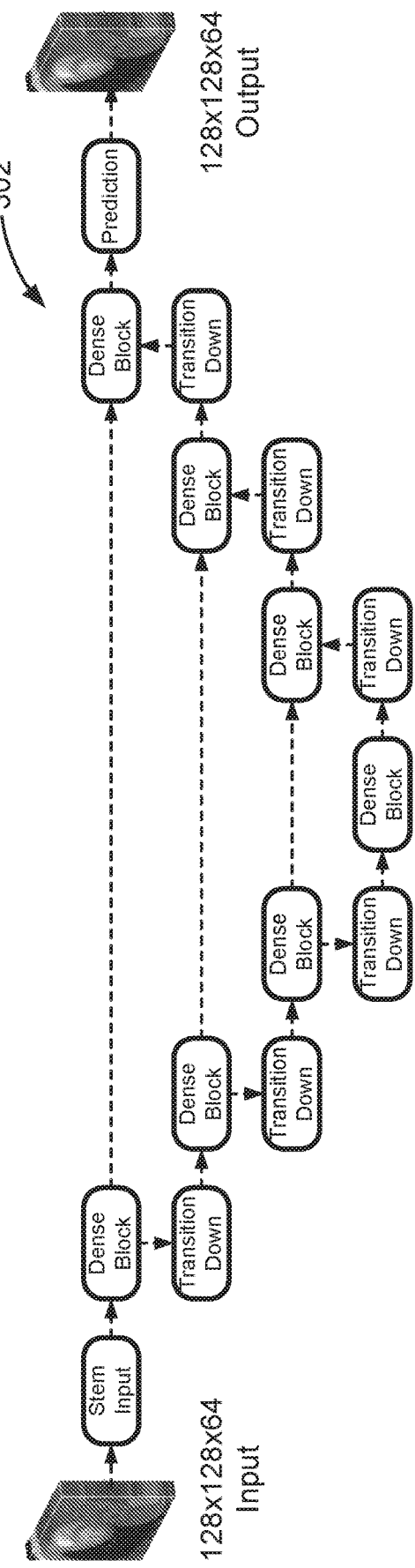
FIG. 3A
FIG. 3B

SYSTEMS AND METHODS OF DEEP LEARNING FOR LARGE-SCALE DYNAMIC MAGNETIC RESONANCE IMAGE RECONSTRUCTION

CROSS REFERENCE TO RELATED APPLICATIONS

This application is a U.S. National Stage of International Application No. PCT/US2020/050247, filed Sep. 10, 2020, which claims priority to and the benefit of U.S. Provisional Patent Application No. 62/900,279, filed Sep. 13, 2019, each of which is hereby incorporated by reference herein in its entirety.

STATEMENT REGARDING FEDERALLY SPONSORED RESEARCH OR DEVELOPMENT

This invention was made with government support under Grant No. R01 EB028146 awarded by National Institutes of Health. The government has certain rights in the invention.

TECHNICAL FIELD

The present disclosure relates biomedical imaging and analysis. More specifically, the present disclosure relates to MRI image reconstruction using deep learning techniques.

BACKGROUND

Dynamic imaging plays an important role in many clinical magnetic resonance imaging (MRI) exams. Dynamic imaging allows healthcare professionals to assess tissue health by visualizing and/or measuring dynamic process taking place within the body, such as cardiac motion, respiration, etc. However, dynamic MRI can be a relatively slow process, and generally necessitates acceleration methods in order to reconstruct images from incomplete imaging data. Thus, there is a need for new systems and methods that can more efficiently and rapidly decode image data and reconstruct image sequences.

SUMMARY

According to aspects of the present disclosure, a method for performing magnetic resonance (MR) imaging on a subject comprises obtaining undersampled imaging data from a region of interest of the subject, the undersampled imaging data corresponding to an image sequence having a plurality of image frames; extracting one or more temporal basis functions from the undersampled imaging data, each of the one or more temporal basis functions corresponding to at least one time-varying dimension of the subject; extracting one or more preliminary spatial weighting functions from the undersampled imaging data, each of the one or more preliminary spatial weighting functions corresponding to a spatially-varying dimension of the subject; inputting the one or more preliminary spatial weighting functions into a neural network to produce one or more final spatial weighting functions, each of the final spatial weighting functions corresponding to a respective one of the one or more preliminary spatial weighting functions; and multiplying the one or more final spatial weighting functions by the one or more temporal basis functions to generate the image sequence.

According to aspects of the present disclosure, a method of training a neural network having an architecture including one or more operations and one or more adjustable weights for use in analyzing magnetic resonance (MR) data from a subject comprises receiving one or more training input data sets to the neural network, the one or more training input data sets including one or more sets of training preliminary spatial weighting functions and one or more sets of training final spatial weighting functions, each of the one or more sets of training final spatial weighting functions being a previously-obtained artifact-free version of a respective one of the one or more sets of training preliminary spatial weighting functions, each of the one or more sets of training preliminary spatial weighting functions and training final spatial weighting functions corresponding to a time-varying dimension of the subject; processing the one or more sets of training preliminary spatial weighting functions according to an architecture of the neural network to produce one or more sets of estimated final spatial weighting functions; comparing each of the one or more sets of estimated final spatial weighting functions to a corresponding one of the one or more sets of training final spatial weighting functions; determining if a cost function of the neural network is satisfied by the one or more sets of estimated final spatial weighting functions, the cost function configured to minimize differences between the one or more sets of training final spatial weighting functions and the one or more sets of estimated final spatial weighting functions; adjusting the one or more network weights responsive to a determination that the cost function of the neural network is not satisfied; and repeatedly processing the one or more training preliminary spatial weighting functions with the adjusted one or more network weights until the cost function is satisfied.

According to aspects of the present disclosure, a system for performing magnetic resonance (MR) imaging on a subject comprises a magnet operable to provide a magnetic field; a transmitter operable to transmit to a region within the magnetic field; a receiver operable to receive a magnetic resonance signal from the region with the magnetic field; and one or more processors operable to control the transmitter and the receiver, the one or more processors being configured to cause the following method to be performed: obtaining undersampled imaging data from a region of interest of the subject, the undersampled imaging data corresponding to an image sequence having a plurality of image frames; extracting one or more temporal basis functions from the undersampled imaging data, each of the one or more temporal basis functions corresponding to at least one time-varying dimension of the subject; extracting one or more preliminary spatial weighting functions from the undersampled imaging data, each of the one or more preliminary spatial weighting functions corresponding to a spatially-varying dimension of the subject; inputting the one or more preliminary spatial weighting functions into a neural network to produce one or more final spatial weighting functions, each of the final spatial weighting functions corresponding to a respective one of the one or more preliminary spatial weighting functions; and multiplying the one or more final spatial weighting functions by the one or more temporal basis functions to generate the image sequence.

According to aspects of the present disclosure, a non-transitory machine-readable medium having stored thereon instructions for performing magnetic resonance (MR) imaging on a subject, which when executed by at least one processor, cause the following method to be performed: obtaining undersampled imaging data from a region of interest of the subject, the undersampled imaging data corresponding to an image sequence having a plurality of image frames; extracting one or more temporal basis functions from the undersampled imaging data, each of the one or more temporal basis functions corresponding to at least one time-varying dimension of the subject; extracting one or more preliminary spatial weighting functions from the undersampled imaging data, each of the one or more preliminary spatial weighting functions corresponding to a spatially-varying dimension of the subject; inputting the one or more preliminary spatial weighting functions into a neural network to produce one or more final spatial weighting functions, each of the final spatial weighting functions corresponding to a respective one of the one or more preliminary spatial weighting functions; and multiplying the one or more final spatial weighting functions by the one or more temporal basis functions to generate the image sequence.

According to aspects of the present disclosure, a system for of training a neural network for use in analyzing magnetic resonance (MR) data from a subject, the neural network having an architecture including one or more operations and one or more adjustable weights, comprises a magnet operable to provide a magnetic field; a transmitter operable to transmit to a region within the magnetic field; a receiver operable to receive a magnetic resonance signal from the region with the magnetic field; and one or more processors operable to control the transmitter and the receiver, the one or more processors being configured to cause the following method to be performed: receiving one or more training input data sets to the neural network, the one or more training input data sets including one or more sets of training preliminary spatial weighting functions and one or more sets of training final spatial weighting functions, each of the one or more sets of training final spatial weighting functions being a previously-obtained artifact-free version of a respective one of the one or more sets of training preliminary spatial weighting functions, each of the one or more sets of training preliminary spatial weighting functions and training final spatial weighting functions corresponding to a time-varying dimension of the subject; processing the one or more sets of training preliminary spatial weighting functions according to an architecture of the neural network to produce one or more sets of estimated final spatial weighting functions; comparing each of the one or more sets of estimated final spatial weighting functions to a corresponding one of the one or more sets of training final spatial weighting functions; determining if a cost function of the neural network is satisfied by the one or more sets of estimated final spatial weighting functions, the cost function configured to minimize differences between the one or more sets of training final spatial weighting functions and the one or more sets of estimated final spatial weighting functions; adjusting the one or more network weights responsive to a determination that the cost function of the neural network is not satisfied; and repeatedly processing the one or more training preliminary spatial weighting functions with the adjusted one or more network weights until the cost function is satisfied.

According to aspects of the present disclosure, a non-transitory machine-readable medium having stored thereon instructions for training a neural network for use in analyzing magnetic resonance (MR) data from a subject, the neural network having an architecture including one or more operations and one or more adjustable weights, cause the following method to be performed: receiving one or more training input data sets to the neural network, the one or more training input data sets including one or more sets of training preliminary spatial weighting functions and one or more sets of training final spatial weighting functions, each of the one or more sets of training final spatial weighting functions being a previously-obtained artifact-free version of a respective one of the one or more sets of training preliminary spatial weighting functions, each of the one or more sets of training preliminary spatial weighting functions and training final spatial weighting functions corresponding to a time-varying dimension of the subject; processing the one or more sets of training preliminary spatial weighting functions according to an architecture of the neural network to produce one or more sets of estimated final spatial weighting functions; comparing each of the one or more sets of estimated final spatial weighting functions to a corresponding one of the one or more sets of training final spatial weighting functions; determining if a cost function of the neural network is satisfied by the one or more sets of estimated final spatial weighting functions, the cost function configured to minimize differences between the one or more sets of training final spatial weighting functions and the one or more sets of estimated final spatial weighting functions; adjusting the one or more network weights responsive to a determination that the cost function of the neural network is not satisfied; and repeatedly processing the one or more training preliminary spatial weighting functions with the adjusted one or more network weights until the cost function is satisfied.

The foregoing and additional aspects and implementations of the present disclosure will be apparent to those of ordinary skill in the art in view of the detailed description of various embodiments and/or implementations, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

FIG. 3A is a first example of a neural network for use in generating magnetic resonance image sequences, according to aspects of the present disclosure;

FIG. 3B is a second example of a neural network for use in generating magnetic resonance image sequences, according to aspects of the present disclosure;

Figure 1:
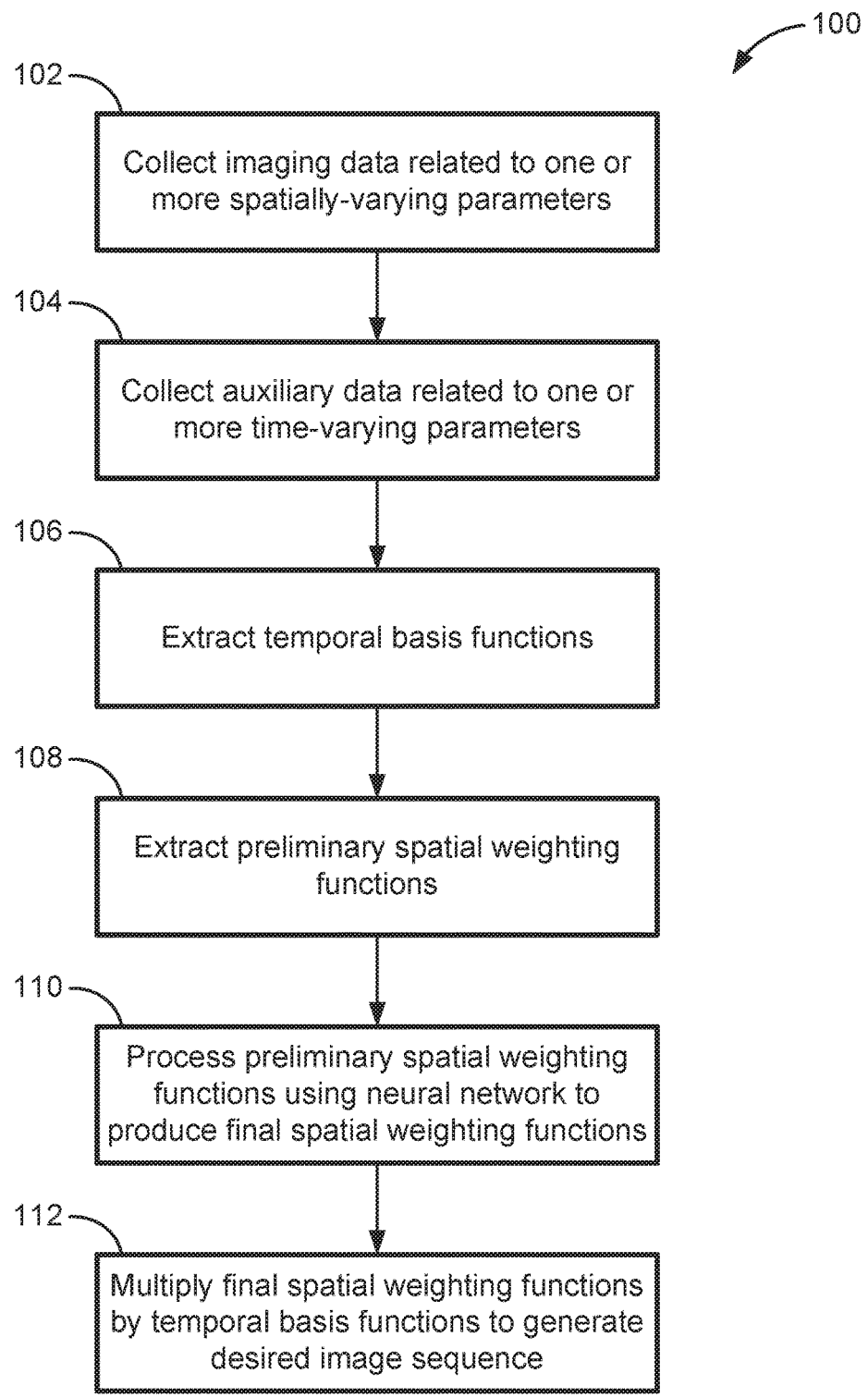
FIG. 1 shows a method for performing magnetic resonance imaging on a subject, according to aspects of the present disclosure.

While the present disclosure is susceptible to various modifications and alternative forms, specific implementations and embodiments have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

While the present disclosure has been described with reference to one or more particular embodiments or implementations, those skilled in the art will recognize that many changes may be made thereto without departing from the spirit and scope of the present disclosure. Each of these embodiments or implementations and obvious variations thereof is contemplated as falling within the spirit and scope of the present disclosure. It is also contemplated that additional embodiments implementations according to aspects of the present disclosure may combine any number of features from any of the embodiments or implementations described herein.

Magnetic resonance-based imaging (MR imaging) is a technique most often used for imaging the human body that takes into account principles of nuclear magnetic resonance. For example, doctors and other medical professionals often use MR imaging to view tissue within the human body. Nuclear magnetic resonance is a phenomenon in which nuclei (such as protons in body tissue) localized in a magnetic field emit energy that can be detected. This energy that is detected can be used to create an image. MR imaging generally involves two principle steps. First, the magnetic moment of the nuclei (a vector property of a nucleus caused by the intrinsic spin property of elementary particles) are aligned (or polarized) by the presence of an external magnetic field. While in the presence of this external magnetic field, the magnetic moment of each nuclei will generally precess about an axis parallel to the magnetic field. The rate of this precession $\omega$ is generally proportional to $\gamma B_0$, where $B_0$ is the magnitude of the external magnetic field, and $\gamma$ is the gyromagnetic ratio of the nuclei, which is the ratio the nuclei's magnetic moment to its angular momentum. The rate of the precession $\omega$ is considered the nuclei's resonant frequency.

The second principle step in MR imaging is to apply an electromagnetic pulse sequence (usually a radiofrequency, or RF, pulse) to the nuclei. When the frequency of the RF pulses sequence is generally equal to the resonant frequency of the nuclei, the nuclei absorb the energy of the RF pulse and the magnetic moments are rotated out of alignment with the magnetic field. The magnetic moments of the excited nuclei eventually re-align within the presence of the external magnetic field in a process known as relaxation, which has two components, $T_1$ and $T_2$. $T_1$ relaxation describes how the component of the magnetic moment parallel to the external magnetic field returns to its initial value. $T_2$ relaxation describes how the components of the magnetic moment perpendicular to the external magnetic field return to their initial value. Because the magnetic moments of nuclei in the external magnetic field without the RF pulse sequence applied are generally parallel to the external magnetic field, $T_1$ relaxation generally describes how parallel component of the magnetic moment returns to its maximum value, while $T_2$ relaxation generally describes how the perpendicular components of the magnetic moment decay. The nuclei of different material relax at different rates and thus emit differing signals, which can be detected and used to form an image identifying the different materials.

Dynamic MR can produce a spatiotemporal image sequence $l(x,t)$, which is a function of (i) spatial location within the subject and (ii) one or more time-varying parameters related to the dynamic processes. The spatial location is denoted by vector $x=[x_1, x_2, x_3]^T$, which contains up to three spatially-varying parameters $x_i$. The time-varying parameters are denoted by vector $t=[t_1, t_2, \ldots, t_R]^T$ containing R time-varying independent variables $t_1$. The image sequence $l(x,t)$ can be represented as a matrix $A \in C^{M \times N}$ with elements $A_{ij}=l(x_i,t_j)$, where the matrix A has M spatial locations (voxels) and N time points (frames). The matrix A is spatially encoded by the MR scanner, which produces a vector of encoded data $d=E(A)$, where $E(\bullet)$ generally includes at least a partial spatial Fourier encoding and additional spatial encodings based on the receiver coil sensitivity patterns. To recover the image sequence A from the measured data d, an operation $f$ must be determined such that $A=f(d)$. Generally, it is not possible to sample the data d at or above the spatiotemporal Nyquist rate, so the data d are undersampled. This leads to an ill-posed inverse problem, such that a general $f(\bullet)=E^{-1}(\bullet)$ does not exist. Thus, it can be difficult to directly operate on the data d to obtain the matrix A of images from this incomplete data.

Referring now to FIG. 1, a method 100 of performing magnetic resonance imaging on a subject and generating a desired image sequence is shown. At step 102, imaging data of the subject (which can be a human such as a patient in a healthcare facility, or a non-human) is collected using MRI equipment. The imaging data is generally obtained using multiple different spatial encodings. Generally, the imaging data is from a specific region of interest of the subject. In an example, the region of interest could be the subject's abdomen or chest. In other examples, the region of interest of the subject is more specific. For example, the region of interest could be an organ, such as the subject's liver, lungs, heart, pancreas, brain, prostate, breast, or any other organ. The imaging data is dependent on or related to the spatially-varying and time-varying parameters of the region of interest of the subject referred to above. These parameters can include relaxation parameters such as $T_1$, $T_{1\rho}$ (also known as T1-rho), $T_2$, or $T_2^*$ (also known as T2-star). The parameters can also include a contrast agent kinetic parameter, a diffusion parameter (which includes changing strength, changing direction, or both), elastographic wave propagation, dynamic contrast enhancement, magnetization transfer, chemical exchange saturation transfer, free induction decay, flow, cardiac motion, respiratory motion, or the general passage of time.

The parameters can be spatially-varying or time-varying, and some of the parameters can vary across both space and time. For example, cardiac motion is generally a time-varying parameter, while the relaxation parameters, the contrast agent kinetic parameter, and the diffusion parameter are generally time-varying. Generally, the imaging data is indicative of the value or magnitude of the spatially-varying parameters and/or the time-varying parameters.

In an example, the region of interest is the subject's abdomen containing their liver, and the spatially-varying parameter that is being measured is the $T_1$ relaxation parameter. The $T_1$ relaxation parameter can be spatially-varying, meaning that the value of the $T_1$ relaxation parameter at a first physical location within the subject's liver can be different than the value of the $T_1$ relaxation parameter at a second physical location within the subject's liver. In a resulting image showing the value measured $T_1$ relaxation parameter, different locations in the image (corresponding to different physical locations within the subject's liver) will show different values. In some implementations, the spatially-varying parameters can also be time-varying. In other implementations, the spatially-varying parameters can additionally or alternatively be related to physical motion of the region of interest of the subject. In general, the techniques disclosed herein can be used to perform dynamic imaging that resolves parameters that can vary across space and time.

To collect the imaging data, an RF pulse sequence is applied to the region of interest of the subject. The resulting signal(s) are then measured. Thus, the RF pulse sequence may be designed using saturation recovery pulses to measure $T_1$ relaxation, $T_2$ prep pulses to measure $T_2$ relaxation, or any other specific pulse sequence to measure a specific spatially-varying parameter or combination of spatially-varying parameters. There is generally a pause after each RF pulse of the RF pulse sequence to allow for the resulting signal to be measured. In some implementations, the imaging data is collected in a semi-continuous mode. In the semi-continuous mode, the RF pulse sequence contains additional pauses to allow the $T_1$ signal to recover (as measurement can reduce/saturate the $T_1$ signal). In other implementations, the imaging data is collected in a continuous mode, where the applied RF pulse sequence is not paused to allow the $T_1$ signal to recover, and only contains pauses to allow for measurement of the resulting signal. In either implementation, the applied RF pulse sequence is not paused to wait for any particular respiratory position, but rather the subject is allowed to breathe freely.

At step 104, auxiliary data is obtained from the subject. The auxiliary data is related to one or more time-varying parameters of the region of interest of the subject, and is generally indicative of the value or magnitude of the time-varying parameters. In some implementations, the auxiliary data is collected simultaneously with the imaging data. In other implementations, the auxiliary data is collected before or after the imaging data. Generally, the auxiliary data (sometimes called subspace training data or navigator data) is a subset of d, e.g., is obtained using only some of the different spatial encodings. The time-varying parameters measured by the auxiliary data can be related to the physical position of different structures within the subject. For example, one time-varying parameter is the position of the subject's chest or abdomen during a respiratory cycle, e.g. while the patient is breathing. In some implementations, the auxiliary data can take the form of an external respiratory gating signal. In this implementations, the time-varying parameter measured by the auxiliary data is the position of the chest wall. In other implementation, the auxiliary data can take the form of a respiratory navigator signal, which can measure the position of the subject's liver dome. In additional implementations, the auxiliary data can take the form of training data interleaved with the imaging data. In these implementations, the training data is generally a subset of the imaging data (which measures spatially-varying parameters) which differs only in the time at which it was obtained. This subset of imaging data is generally measured at a rate which is sufficient to resolve any motion of the region of interest.

As noted herein, it can be difficult to directly operate on the data d to obtain the matrix A of images. However, due to strong relationships between different image frames, the image sequence can be represented using linear sub-space modeling: $l(x,t)=\Sigma_{l=1}^{L} u_l(x)\varphi_l(t)$. This model can generally be used when the matrix A has a low rank $L<\min(M,N)$. With this model, matrix A can be factored as $A=U\Phi$, where $U \in C^{M \times L}$ has elements $U_{il}=u_l(x_i)$ and $\Phi \in C^{L \times N}$ has elements $\Phi_{lj}=\varphi_l(t_j)$.

In this formulation, U is known as a spatial factor. In some implementations, this formulation is used for dynamic imaging with only one time dimensions, in which case U is a spatial factor matrix. In other implementations, this formulation is used for dynamic imaging with multiple time dimensions, in which case U is a spatial factor tensor. The spatial factor contains one or more spatial weighting functions that describe the properties of the spatial dimensions $x_i$. Similarly, $\Phi$ is known as a temporal factor, which contains one or more temporal basis functions describing properties of the various time dimensions $t_i$. The group of spatial weighting functions in the spatial factor U is known as the spatial feature map, such that the columns of the spatial factor U are feature maps containing the coordinates for $l(x,t)$ within a temporal feature space spanned by $\{\varphi_l(t_j)\}_{l=1}^{L}$.

Referring to step 106, the temporal basis functions can generally be extracted directly from the auxiliary data using techniques such as principal component analysis. As noted, each temporal basis function generally corresponds to at least one time-varying dimension of the subject. Because the temporal basis functions can be extracted directly from the data d, the temporal factor $\Phi$ is predetermined, and the problem formulation is updated to $d=E(U\Phi)=E_\Phi(U)$. Thus, once the temporal basis functions have been extracted, generating the desired image sequence requires identifying some function $f_\Phi$ such that $f_\Phi(d) \approx U$, e.g., solving for U.

In some instances, sparse recovery methods such as compressed sensing can be used to find a U which itself has a sparse representation $\Psi(U)$, e.g., by solving the nonlinear reconstruction problem $f_\Phi(d)=\arg\min_U \|d-E_\Phi(U)\|_2^2+\lambda \|\Psi(U)\|_1$. This equation can be solved for U by backprojecting d onto the feature space (e.g., the one or more spatial weighting functions) as $E_\Phi^*(d)$ (where * denotes the adjoint) or as a pre-conditioned $E_{\Phi,pc}^*(d)$, and then performing nonlinear iterative reconstruction such as the alternating direction method of multipliers upon the result entirely within the temporal feature space. However, this process can be rather slow, particularly for non-Cartesian sampling patterns, for which $E_p(\cdot)$ includes one or more non-invertible, non-separable multidimensional non-uniform fast Fourier transforms, instead of invertible, separable fast Fourier transforms.

Referring now to steps 108 and 110, the spatial factor U containing the spatial weighting function can be obtained by using a neural network. At step 108, a preliminary feature map $U_0$ is extracted from the imaging data d, e.g., preliminary spatial weighting functions are extracted. In some implementations, $U_0=E_{\Phi,pc}^*(d)=S^\dagger F_{NU}^H W \Omega^*(d) \Phi^H$, where $\Omega^*(\cdot)\Omega^H$ transforms the imaging data into the temporal feature space, $F_{NU}^H W$ regrids the non-Cartesian data by applying a density compensation function (the diagonal matrix W) and the adjoint non-uniform fast Fourier transform $F_{NU}^H$ (a process similar to filtered backprojection), and where the pseudoinverse $S^\dagger$ performs a complex coil combination. Generally, these preliminary spatial weighting functions contain some type of artifact or corruption that make them unsuitable for use in generating the desired image sequence.

At step 110, the preliminary spatial weighting functions (e.g., the preliminary feature map) are input into a neural network having a specific architecture with various parameters. In some implementations, the neural network is a multi-channel neural network, such as a dilated multi-level densely connected network, an AutoEncoder (AE) network, or another neural network such as DenseUnet, Unet, AlexNet, Residual Network (ResiNet), and Network in Network (NIN). Generally, any suitable neural network can be used. In some implementations, the neural network includes one or more densely-connected blocks that contain a number of convolution layers, a number of activation functions, and a certain growth rate. The convolution layers can be 3×3 convolution layers. The activation functions can be an exponential linear unit. The growth rate of the densely-connected blocks can be 128. Generally, a wide variety of different neural networks can be used.

The neural network processes the preliminary spatial weighting function according to the parameters of its architecture and the weights of these parameters. Generally, the various parameters refer to different types of operations being used, and the weights refer to the magnitude of these operations, threshold values used, or any other adjustable property of the parameter. The output of the neural network is one or more final spatial weighting functions. Generally, each final spatial weighting function is an artifact-free (e.g., complete) version of a corresponding preliminary spatial weighting functions. The neural network thus is able to learn highly efficient image representations and rapidly decode image data, even for image sequences with greater than 40,000 frames.

Finally, at step 112, the final spatial weighting functions are multiplied by the temporal basis functions in any desired sequence or manner to generate the desired image sequence. In some implementations, the neural network itself multiplies the final spatial weighting functions and the temporal basis functions, in which case the temporal basis functions must also be input into the neural network. In other implementations, this multiplication is performed by some other entity, such as a separate processing device, or separate software or hardware module.

Figure 2:
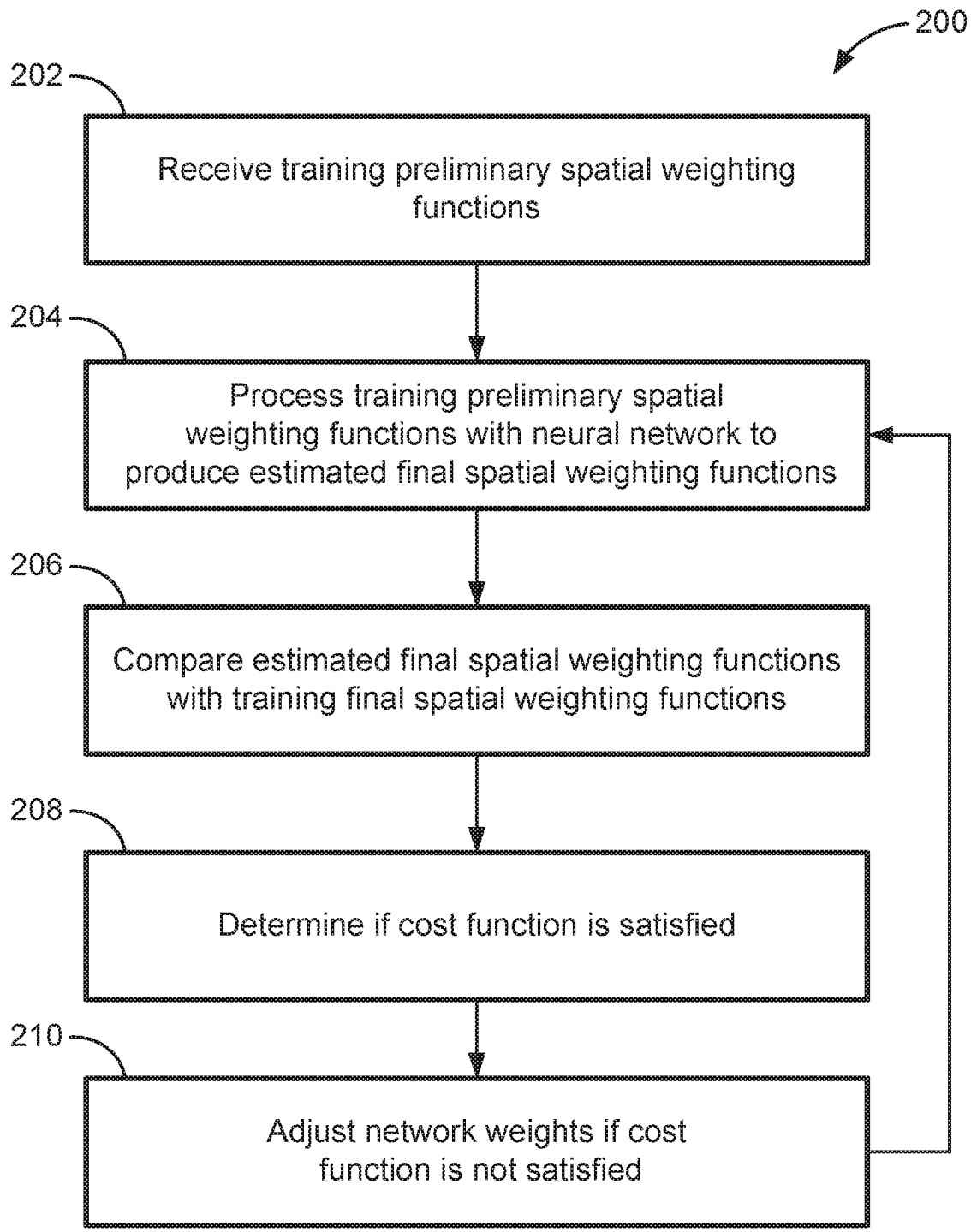
FIG. 2 shows a method for training a neural network, according to aspects of the present disclosure.

In order to properly utilize the neural network, it must first be trained using reference data. A method 200 for training a neural network for use in MR image reconstruction is shown in FIG. 2. In method 200, the neural network is trained using training data, which generally includes a set of training preliminary spatial weighting functions and a set of training final spatial weighting functions. The training final spatial weighting functions are generally artifact-free versions of the training preliminary spatial weighting functions that have been obtained using methods other than the neural network, such as conventional iterative reconstruction. The goal of training the neural network is to have the neural network learn how to process the training preliminary spatial weighting functions to produce the training final spatial weighting functions.

At step 202, the neural network receives the training preliminary spatial weighting functions, which relate to a variety of time-varying dimensions of a subject being imaged. At step 204, the neural network processes the training preliminary spatial weighting functions to produce estimated final spatial weighting functions. At step 206, the neural network compares the estimated final spatial weighting functions to the training final spatial weighting functions, which are generally the "goal" of the neural network.

At step 208, the neural network determines if its cost function has been satisfied. The cost function of the neural network (also known as the loss function) describes how closely the current output of the neural network matches the desired output that the neural network is trying to reproduce. Thus, in method 200, the cost function describes how closely the estimated final spatial weighting functions match the training final spatial weighting functions. As shown in step 208, after producing the estimated final spatial weighting functions and comparing them to the training final spatial weighting functions, the neural network determines if the cost function has been satisfied, e.g., whether the estimated final spatial weighting functions are sufficiently similar to the training final spatial weighting functions. The different between the estimated and training final spatial weighting functions is known as the loss of the network.

If the cost function has not been satisfied, method 200 proceeds to step 210, where the various weights of the neural network are adjusted according to a cost function. Generally, the neural network has an architecture that includes a variety of different filters, operations, activations, etc. Each of these different processing steps can have various properties, such as which filter is applied, how various inputs are multiplied, etc. The values related to the processing steps are referred to as the "weights" of the neural network architecture. These weights can be adjusted to modify the output of the neural network. The neural network then repeats steps 204, 206, and 208 to (i) produce a new set of estimated final spatial weighting functions, (ii) compare the new set of estimated final spatial weighting functions to the training final spatial weighting functions, and (iii) determine if the cost function has been satisfied with the adjusted network weights. This process is repeated until the cost function is satisfied, at which point the neural network is sufficiently trained.

Many different optimization techniques or algorithms for training the neural network can be used. In one implementation, a gradient descent method is used. The gradient is defined as the direction where the loss of the network is increased. Thus, to update the weights of the parameters, a negative gradient is applied to the network parameters according to $\theta_{n+1} = \theta_n - \alpha * \nabla_\theta J(\theta, x^i, y^i)$, where $(x^i, x^i)$ are the data points input data sets, and $\theta$ is the specific parameter whose weight is being updated. In other implementations, other optimization techniques or algorithms can be used, such as mini-batch stochastic gradient descent, momentum optimizer (which takes previous gradients as momentum), Adagrad and Adadelta (adaptive gradient descent, where the learning rate varies for individual weights based on gradient history, RMSProp (root mean square propagation, which uses a moving average of gradient to improve stability), and ADAM (adaptive moment estimation, which applies first and second moments separately for each parameter, and which is a combination of Adagrad and RMSProp).

In some implementations, the cost function of the neural network is configured to minimize differences between the one or more training final spatial weighting functions and the one or more estimated final spatial weighting functions. In other implementations, the cost function is configured to minimize differences between a training image sequence based on the one or more training final spatial weighting functions and an estimated image sequence based on the one or more estimated final spatial weighting functions.

The neural network can be implemented using a variety of different systems or platforms, such as Tensorflow, Keras, Pytorch, or CNTK. The training input data sets can be instance-wise normalized by subtracting their mean and dividing by the standard deviation prior to being fed into the neural networks. In some implementations, the cost function is an Adam optimizer minimizing the L1, L2, or mixed L1-L2 loss between the input data sets and the network output. In some implementations, different L1 and L2 regularizations can be applied to the network weights to avoid overfitting.

Figure 3C:
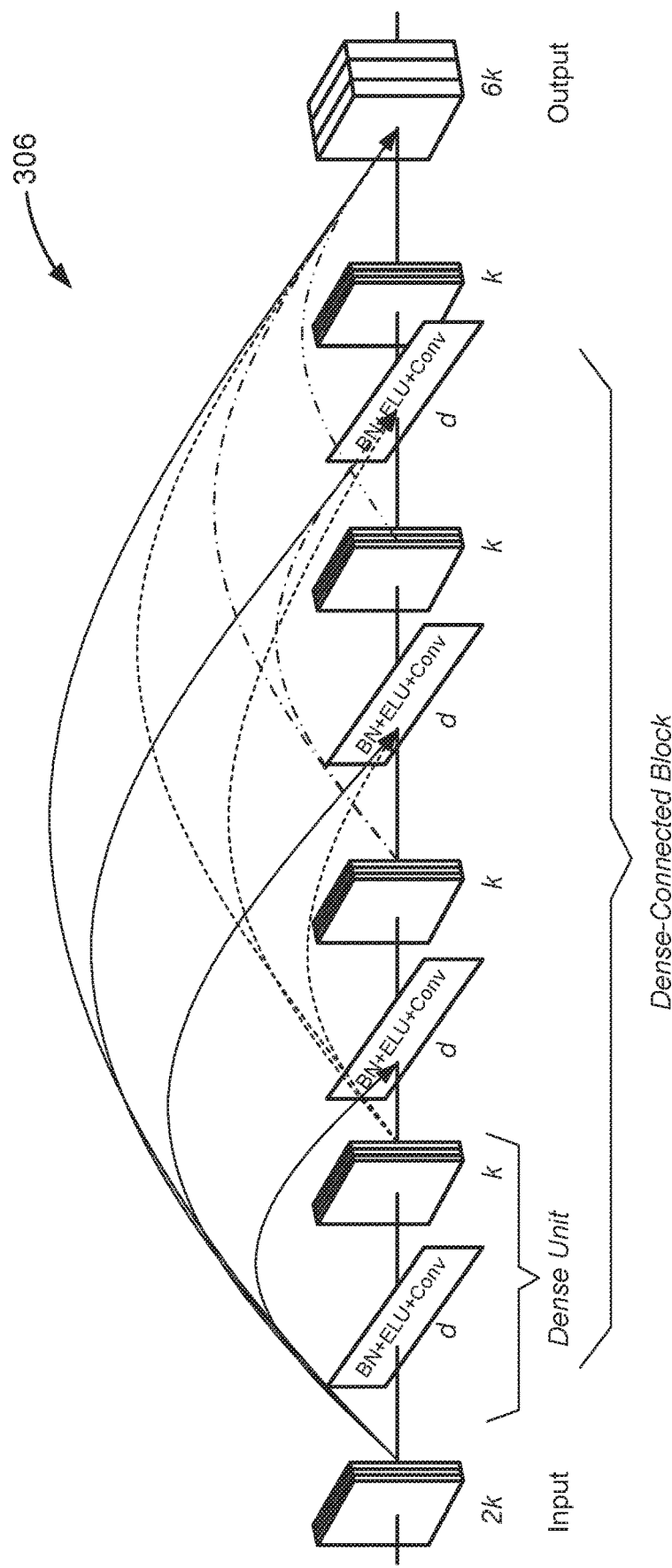
FIG. 3C is an example of a densely-connected block for use in the first or second example neural networks of FIG. 3A and FIG. 3B, according to aspects of the present disclosure.

FIG. 3A and FIG. 3B illustrate two different neural networks that can be utilized in conjunction with aspects of the present disclosure. FIG. 3A shows a dilated multi-level densely connected network 302, while FIG. 3B shows a DenseUnet 304. Both neural networks 302 and 304 can have one or more densely-connected blocks (or "DenseBlocks") 306, an example of which is illustrated in FIG. 3C.

In one example, the neural networks 302 and 304 were trained using image matrices with rank L=32 and a matrix size of 160×160. In this example, the neural networks 302 and 304 were tasked with obtaining a spatial factor matrix U composed of 32 complex-valued 160×160 feature maps. In some examples of the training process, the real and imaginary parts of U can be concatenated into a set of 64 real-valued 160×160 feature maps.

In some implementations, the neural networks are also trained using a domain discriminator. The domain discriminator trains the neural networks to be robust to data sets from domains other than raw MRI data. In these implementations, the training input data sets include both raw MRI data and non-MRI data. In one example, the non-MRI data is a generic video dataset such as ImageNet-VID, which includes a large amount of video clips. During the training process (such as method 200), neural networks are trained to extract the final spatial weighting functions (e.g., feature maps) from the MRI data and the non-MRI data until the neural network produces final spatial weighting functions of sufficient quality from both data sets.

This training is done in an alternating fashion. First, the neural network is trained to distinguish between final spatial weighting functions resulting from MRI data and final spatial weighting functions resulting from non-MRI data. Then, the neural network is trained so as to produce final spatial weighting functions that are as close as possible to the training final spatial weighting functions that were obtained using conventional means. The neural network is then trained again to distinguish between MRI-final spatial weighting functions and non-MRI final spatial weighting functions. These two training schemes alternate until the neural network generates high-quality final spatial weighting functions for MRI and non-MRI data, such that the neural network cannot differentiate between produced final spatial weighting functions originating from different sources. This ensures that the neural network can perform equally well on different image domains, so that the neural network is more robust to unseen data.

Table 1 below shows a variety of different measurements of the performance of the mDCN neural network 302 and the DenseUnet 304 as compared to a conventional iterative reconstruction approach (e.g., a non-neural network approach) to determining final spatial weighting functions. The different measurements include (i) a normalized root mean square error (NRSMSE) of the spatial weighting functions; (ii) 3 different image similar metrics (SSIM, PSNR, and NRMSE) for a reconstructed image sequence of a whole cardiac cycle 920 frames) at the end-expiration (EE) respiratory phase, for inversion times corresponding to bright-blood and dark-blood contrast weightings; and (iii) the accuracy and precision of $T_1$ maps produced from the final spatial weighting functions. Each of these measurements was performed at three different L1 and L2 regularization scales. The runtime for each neural network is also shown.

TABLE 1

| L1&L2 | mDCN d1-4-8-1 | | | DenseUnet | | |
|---|---|---|---|---|---|---|
| Reg. Scale | No-Reg | 1e-3 | 1e-2 | No-Reg | 1e-3 | 1e-2 |
| Image Basis NRMSE | 0.4460 (0.036) | 0.4324 (0.036) | 0.4302 (0.038) | 0.4416 (0.035) | 0.4440 (0.033) | 0.4415 (0.034) |
| Cardiac Cycle SSIM | 0.8329 (0.069) 0.9164 (0.027) | 0.8524 (0.069) 0.9392 (0.026) | 0.8519 (0.070) 0.9398 (0.037) | 0.8450 (0.063) 0.9292 (0.025) | 0.8252 (0.059) 0.9033 (0.026) | 0.8368 (0.062) 0.9128 (0.039) |
| Cardiac Cycle PSNR | 29.44 (2.733) 31.44 (3.052) | 30.51 (2.912) 33.42 (3.081) | 30.70 (2.850) 33.74 (2.989) | 29.97 (2.342) 32.13 (2.243) | 29.16 (2.326) 30.87 (2.385) | 29.70 (2.024) 31.97 (2.021) |
| Cardiac Cycle NRMSE | 0.1754 (0.057) 0.1114 (0.044) | 0.1580 (0.056) 0.0894 (0.035) | 0.1554 (0.061) 0.0863 (0.037) | 0.1643 (0.052) 0.1007 (0.030) | 0.1773 (0.048) 0.1147 (0.028) | 0.1673 (0.050) 0.1013 (0.025) |
| Runtime per case | | 0.39 s | | | 0.46 s | |

As can be seen in Table 1, the mDCN network 302 generally outperformed the DenseUnet 304 and the conventional methods.

Table 2 shows a comparison between different dilation rates of the mDCN network 302 and the DenseUnet 304.

TABLE 2

| | Validation Set | | | | Test Set | |
|---|---|---|---|---|---|---|
| | mDCN | | | DenseUnet | mDCN | DenseUnet |
| Dilation | No Dilation | d1241 | d1481 | No Dilation | d1481 | No Dilation |
| Image Basis NRMSE | 0.4402 (0.042) | 0.4350 (0.041) | 0.4302 (0.038) | 0.4415 (0.034) | 0.4450 (0.055) | 0.4493 (0.052) |

TABLE 2-continued

| | Validation Set | | | | Test Set | |
| --- | --- | --- | --- | --- | --- | --- |
| | mDCN | | | DenseUnet | mDCN | DenseUnet |
| Dilation | No Dilation | d1241 | d1481 | No Dilation | d1481 | No Dilation |
| Cardiac Cycle SSIM | 0.8474 (0.065) 0.9320 (0.024) | 0.8472 (0.071) 0.9351 (0.029) | 0.8519 (0.070) 0.9398 (0.037) | 0.8368 (0.062) 0.9128 (0.039) | 0.8619 (0.070) 0.9382 (0.033) | 0.8381 (0.079) 0.9068 (0.045) |
| Cardiac Cycle PSNR | 29.54 (2.576) 31.20 (3.382) | 30.07 (3.126) 32.49 (3.705) | 30.70 (2.850) 33.74 (2.989) | 29.70 (2.024) 31.97 (2.021) | 30.07 (3.836) 32.07 (4.300) | 29.20 (3.374) 31.27 (4.298) |
| Cardiac Cycle NRMSE | 0.1723 (0.055) 0.1161 (0.047) | 0.1680 (0.068) 0.1050 (0.057) | 0.1554 (0.061) 0.0863 (0.037) | 0.1673 (0.050) 0.1013 (0.025) | 0.1556 (0.056) 0.1052 (0.053) | 0.1687 (0.051) 0.1127 (0.043) |

Figure 4A:
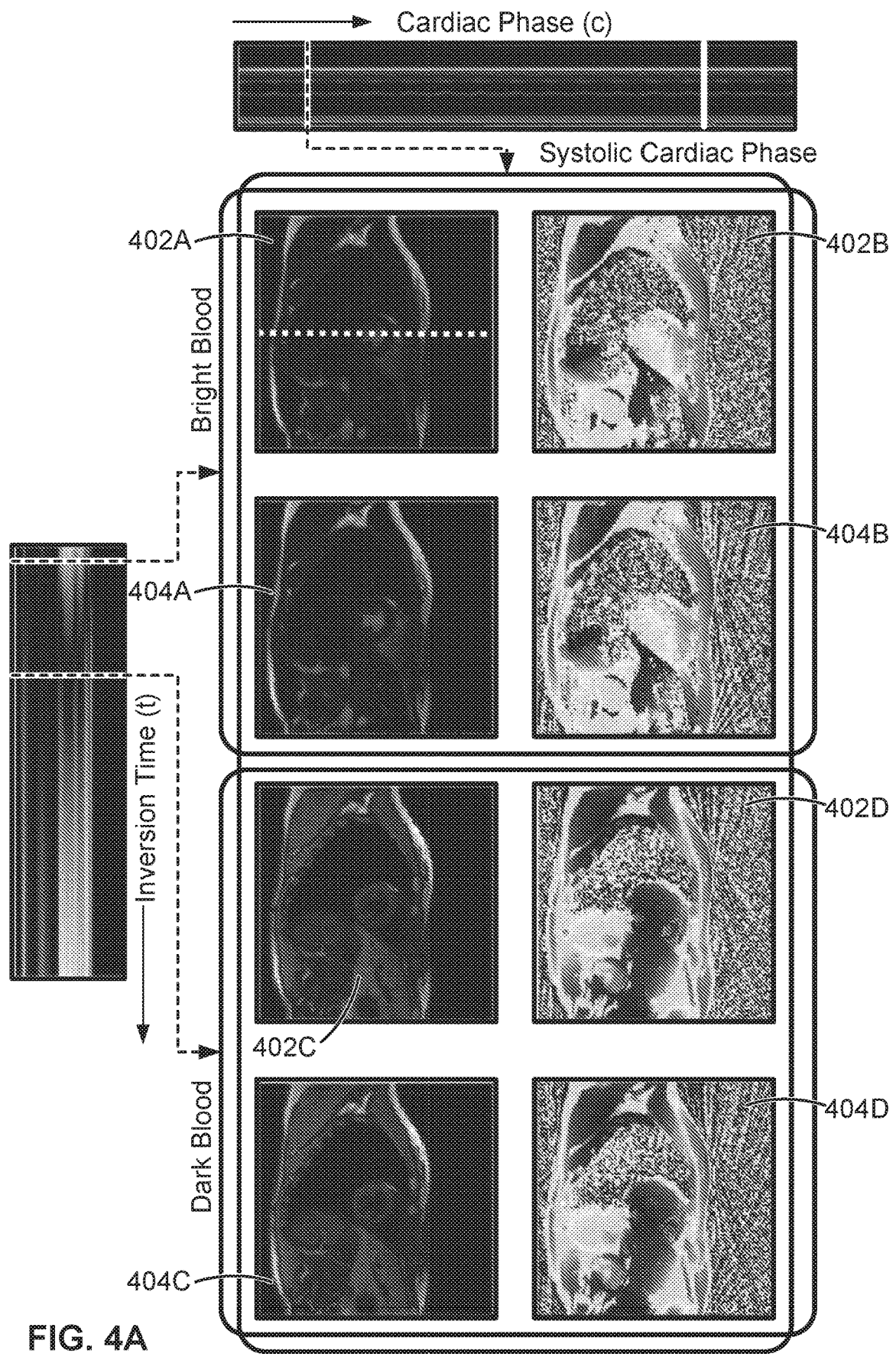
FIG. 4A shows magnetic resonance image sequences of a systolic cardiac phase constructed using the neural networks of FIG. 3A and FIG. 3B, according to aspects of the present disclosure.
Figure 4B:
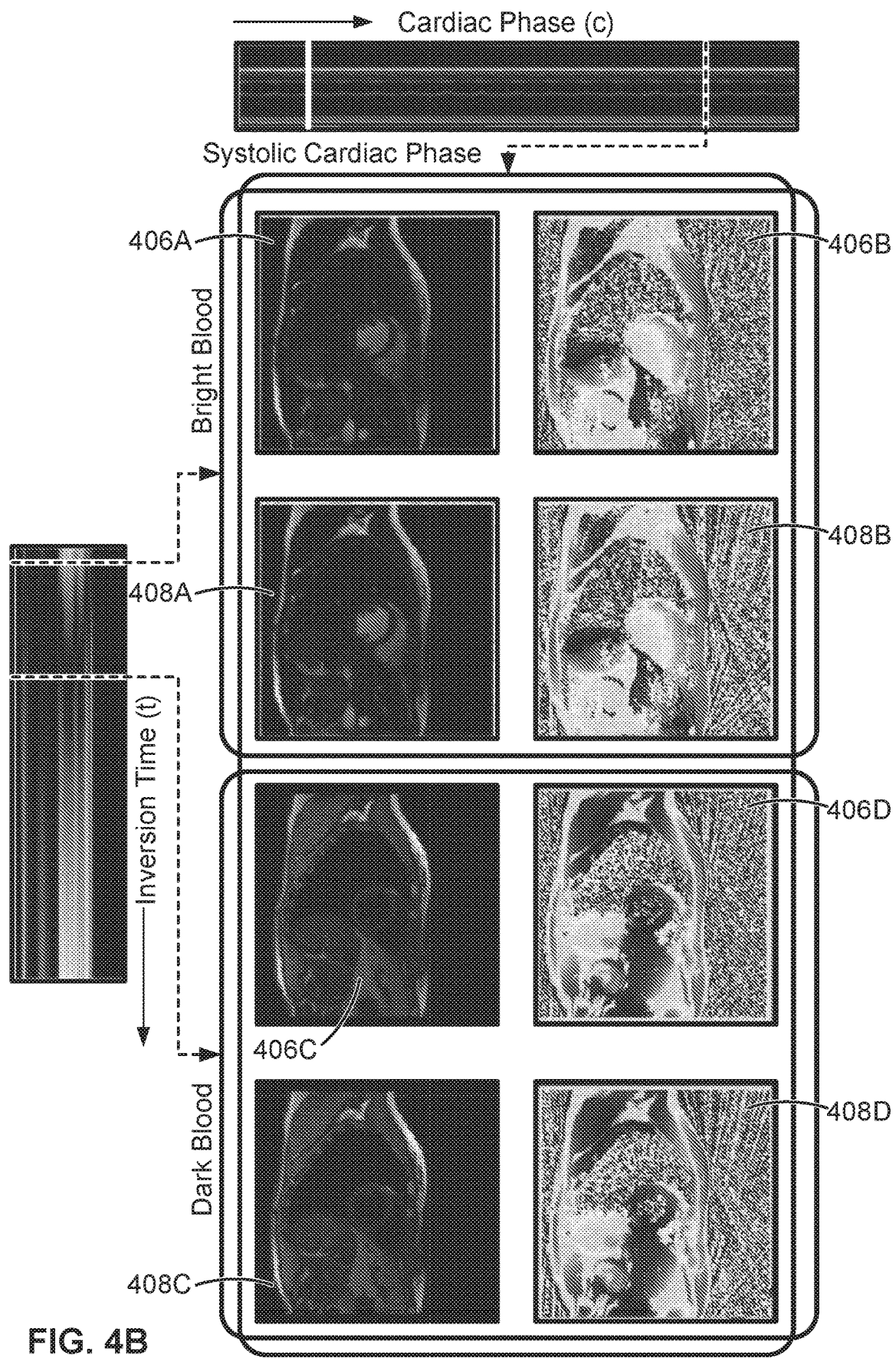
FIG. 4B shows magnetic resonance image sequences of a diastolic cardiac phase constructed using the neural networks of FIG. 3A and FIG. 3B, according to aspects of the present disclosure.

FIGS. 4A and 4B illustrate examples of reconstructed MR images showing multiple contrasts and time dimensions that were reconstructed using mDCN network 302 and conventional techniques. The MR images vary across inversion time (vertical), which shows $T_1$ recovery, and across cardiac phase (horizontal), which shows cardiac motion. FIG. 4A shows MR images during a systolic cardiac phase, while FIG. 4B shows MR images during a diastolic cardiac phase. Images 402A, 4021B, 402C, and 402D in FIG. 4A were obtained using conventional iterative reconstruction techniques. Images 404A, 4041B, 404C, and 404D in FIG. 4A were obtained using the mDCN network 302. Images 406A, 406B, 406C, and 406D in FIG. 4B were obtained using conventional iterative reconstruction techniques. Images 408A, 408B, 408C, and 408D in FIG. 4B were obtained using the mDCN network 302.

Figure 5:
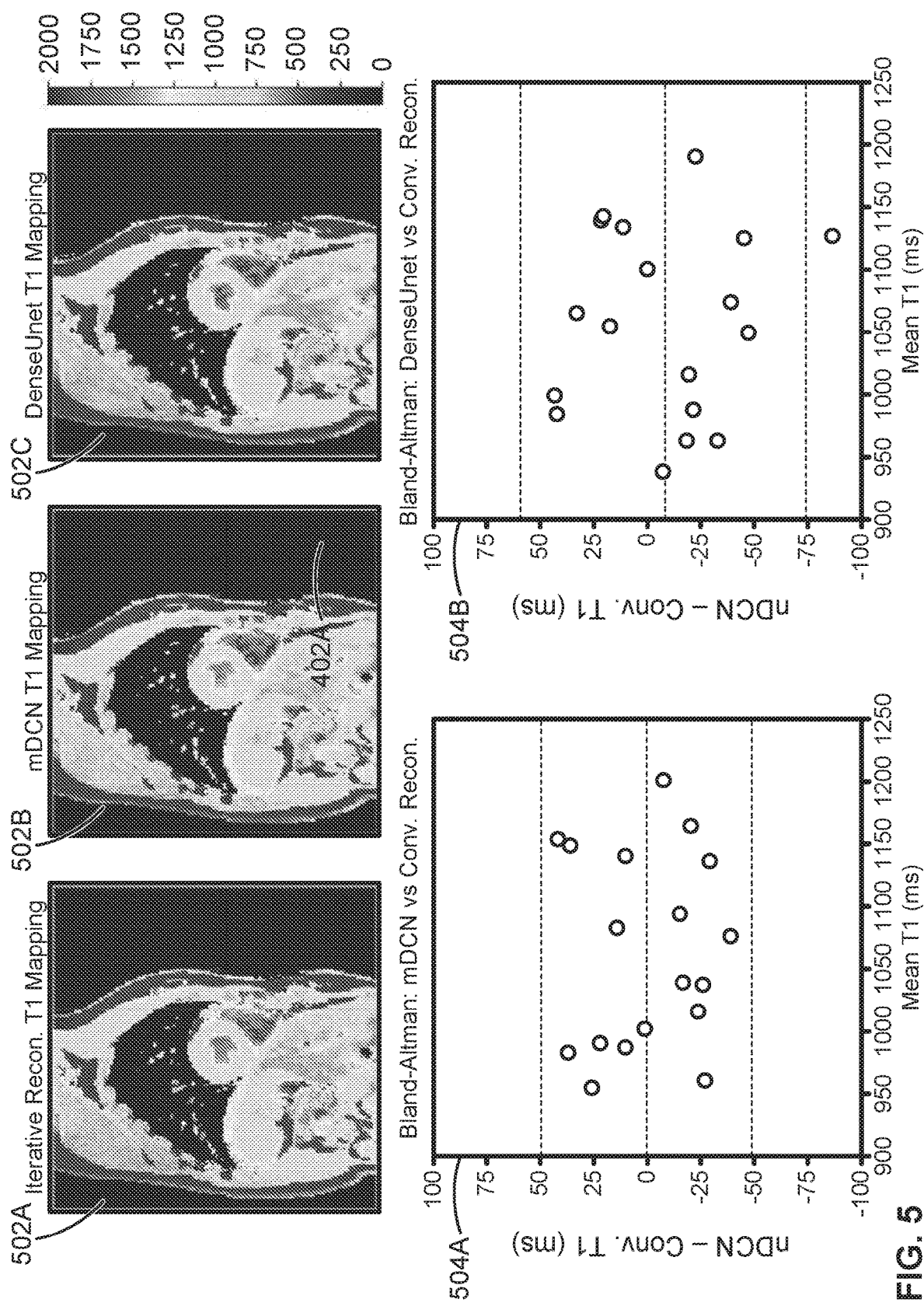
FIG. 5 shows T1 maps and Bland-Altman plots generated using the neural networks of FIGS. 3A and 3B, and conventional techniques, according to aspects of the present disclosure.

FIG. 5 illustrates various example T1 maps constructed using conventional iterative reconstruction techniques (map 502A), the mDCN network 302 (map 502B), and the DenseUnet network 304 (map 502C). FIG. 5 also shows Bland-Altman plots of the T1 fitting results. Plot 504A shows the difference between the mDCN network 302 and conventional iterative reconstruction techniques. Plot 504B shows the difference between the DenseUnet network 304 and conventional iterative reconstruction techniques. Generally, the mDCN T1 maps were more accurate (e.g., showed a smaller bias) and more precise (e.g., had tighter limits of agreement) than the DenseUnet T1 maps and the conventional T1 maps. The T1 maps from both the mDCN network 302 and the DenseUnet network 304 did not show a statistically significant bias. The T1 maps from the mDCN network 302 was slightly correlated with the T1 maps from conventional techniques.

Figure 6:
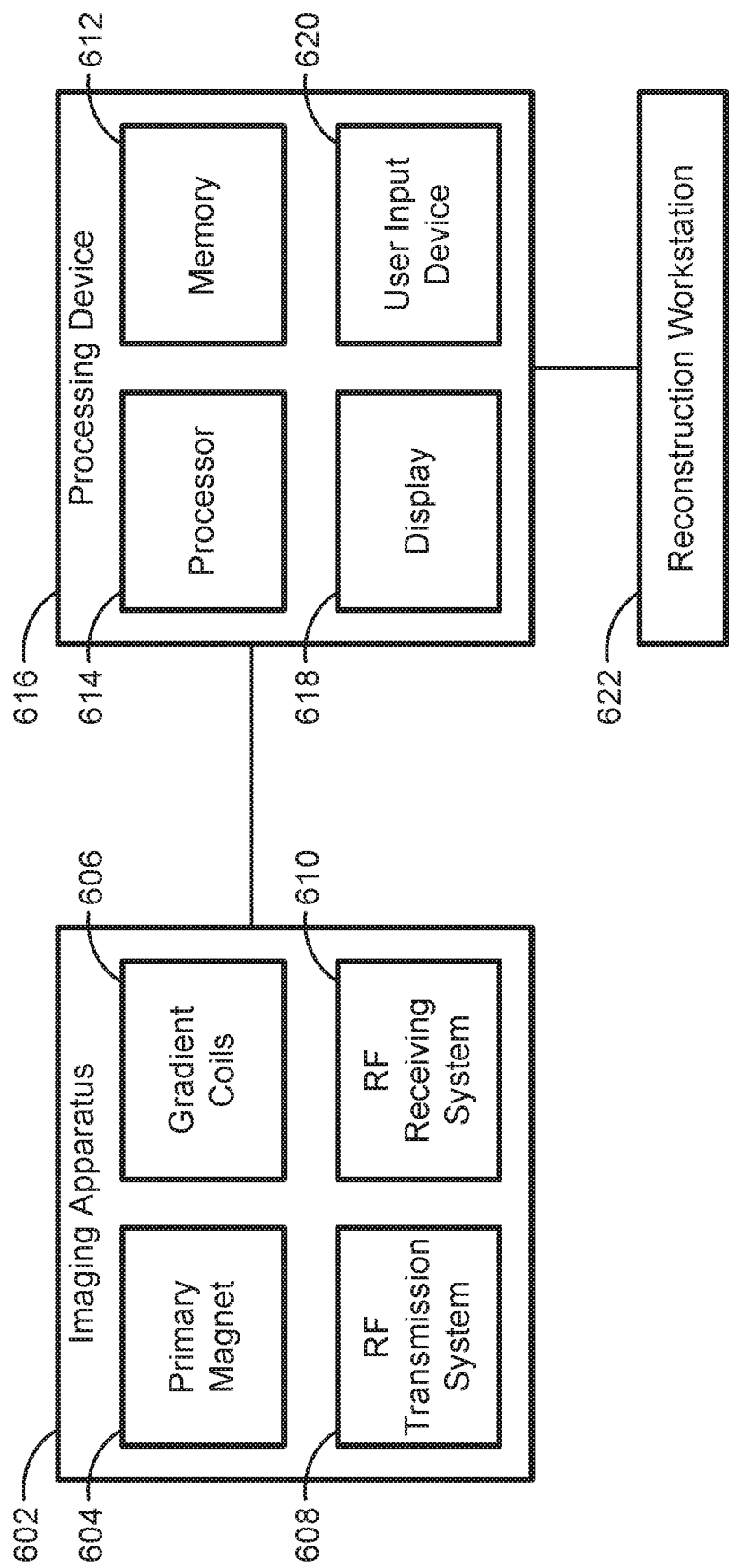
FIG. 6 shows a system for performing magnetic resonance imaging, according to aspects of the present disclosure.

Aspects of the present disclosure can be implemented using a variety of hardware. One such implementation is illustrated in FIG. 6. A system 600 for performing magnetic resonance imaging on a subject includes an imaging apparatus 602, a processing device 612, and a reconstruction workstation 622. The imaging apparatus 602 can be one used for standard magnetic resonance imaging, and can include a primary magnet 604, gradient coils 606, an RF transmission system 608, and an RF receiving system 610. The primary magnet 604 can be a permanent magnet, an electromagnet (such as a coil), or any other suitable magnet. Primary magnet 604 is used to create the external magnet field that is applied to the sample during imaging. Gradient coils 606 create a secondary magnet field that distorts the external magnetic field and can cause the resonant frequency of the protons in the sample to vary by position. The gradient coils 606 can thus be used to spatially encode the positions of protons throughout the sample, e.g. can be used to select which plane intersecting the sample will be used for imaging. The RF transmission system 608 is used to apply the RF pulse sequence that provides energy to the protons in the sample to rotate their magnet moments out of alignment with the external magnetic field, and saturates the solute material protons. The RF transmission system 608 generally includes a frequency generator (such as an RF synthesizer), a power amplifier, and a transmitting coil. The RF receiving system 610 receives the signals emitted by the protons in the sample as they relax back to their standard alignment. The RF receiving system 610 can a receiving coil to receive the emitted signals, and a pre-amplifier for boosting the received signals and ensuring the signals are suitable for processing. In some implementations, the RF receiving system 610 can include a signal processing component that processes the received signals to provide data that is usable by the processing device 612. Each of the component of the imaging apparatus can be disposed within one or more housings.

The processing device 612 can be communicatively coupled to the imaging apparatus 602, and can include a processor 614, processor-executable memory 616, a display 618, and a user input device 620. The processing device 612 is used to manage the operations of the imaging apparatus 602, and can thus be configured to cause the imaging apparatus 602 to perform dynamic imaging according to the principles disclosed herein. The memory 616 can contain instructions that when executed by processor 614, cause the imaging apparatus 602 to operate as desired. The memory 616 can also store the data obtained from the MRI sequence.

The reconstruction workstation 622 is generally a separate processing device or system that receives the imaging data from the processing device 612. The reconstruction workstation can be configured as necessary to perform any analysis of the data, include any or all of the steps in method 100 and method 200. In some implementations, the neural network is implemented on the reconstruction workstation 622. In other implementations, the neural network is implemented on separate hardware that can communicate with the reconstruction workstation 622.

In some implementations, a non-transitory, machine-readable medium has instructions stored thereon for implementing any of any of the methods or processes discussed herein. A machine processor is configured to executed the instructions in order to perform these methods or processes.

Aspects of the present disclosure can be implemented on a variety of types of processing devices, such as general purpose computer systems, microprocessors, digital signal processors, micro-controllers, application specific integrated circuits (ASICs), programmable logic devices (PLDs) field programmable logic devices (FPLDs), programmable gate arrays (PGAs), field programmable gate arrays (FPGAs), mobile devices such as mobile telephones, personal digital assistants (PDAs), or tablet computers, local servers, remote servers, wearable computers, or the like.

Memory storage devices of the one or more processing devices can include a machine-readable medium on which is stored one or more sets of instructions (e.g., software) embodying any one or more of the methodologies or functions described herein. The instructions can further be transmitted or received over a network via a network transmitter receiver. While the machine-readable medium can be a single medium, the term "machine-readable medium" should be taken to include a single medium or multiple media (e.g., a centralized or distributed database, and/or associated caches and servers) that store the one or more sets of instructions. The term "machine-readable medium" can also be taken to include any medium that is capable of storing, encoding, or carrying a set of instructions for execution by the machine and that cause the machine to perform any one or more of the methodologies of the various embodiments, or that is capable of storing, encoding, or carrying data structures utilized by or associated with such a set of instructions. The term "machine-readable medium" can accordingly be taken to include, but not be limited to, solid-state memories, optical media, and magnetic media. A variety of different types of memory storage devices, such as a random access memory (RAM) or a read only memory (ROM) in the system or a floppy disk, hard disk, CD ROM, DVD ROM, flash, or other computer readable medium that is read from and/or written to by a magnetic, optical, or other reading and/or writing system that is coupled to the processing device, can be used for the memory or memories.

While aspects of the present disclosure have been described with reference to one or more particular implementations, those skilled in the art will recognize that many changes may be made thereto without departing from the spirit and scope of the present disclosure. Each of these implementations and obvious variations thereof are contemplated as falling within the spirit and scope of the present disclosure. It is also contemplated that additional implementations according to aspects of the present disclosure may combine any number of features from any of the implementations described herein.

What is claimed is:

1. A method for performing magnetic resonance (MR) imaging on a subject, the method comprising:
    obtaining undersampled imaging data from a region of interest of the subject, the undersampled imaging data corresponding to an image sequence having a plurality of image frames;
    extracting one or more temporal basis functions from the undersampled imaging data, each of the one or more temporal basis functions corresponding to at least one time-varying dimension of the subject;
    extracting one or more preliminary spatial weighting functions from the undersampled imaging data, each of the one or more preliminary spatial weighting functions corresponding to a spatially-varying dimension of the subject;
    inputting the one or more preliminary spatial weighting functions into a neural network to produce one or more final spatial weighting functions, each of the final spatial weighting functions corresponding to a respective one of the one or more preliminary spatial weighting functions; and
    multiplying the one or more final spatial weighting functions by the one or more temporal basis functions to generate the image sequence.

2. The method of claim 1, wherein at least one of the one or more preliminary spatial weighting functions includes imaging artifacts, and wherein the corresponding one of the one or more final spatial weighting functions is an artifact-free estimation of the one of the one or more preliminary spatial weighting functions.

3. The method of claim 1, wherein the neural network is a multi-channel neural network.

4. The method of claim 1, wherein the neural network is a dilated multi-level densely connected network.

5. The method of claim 1, wherein the neural network includes one or more dense blocks, at least one of the one or more dense blocks including one or more convolution layers.

6. The method of claim 1, wherein the neural network includes one or more dense blocks, at least one of the one or more dense blocks including one or more activation functions.

7. The method of claim 6, wherein at least one of the one or more activation functions is an exponential linear unit.

8. The method of claim 1, wherein the neural network includes one or more dense blocks.

9. The method of claim 1, wherein the undersampled imaging data is acquired using a plurality of spatial encodings.

10. The method of claim 9, wherein the undersampled imaging data includes training data acquired at a subset of the plurality of spatial encodings, and wherein the one or more temporal basis functions is extracted from the training data.

11. The method of claim 1, wherein the subject is a human.

12. The method of claim 1, wherein the neural network is trained using one or more training input data sets and one or more reference output data sets, each of the one or more reference output data sets being a previously-obtained artifact-free version of a respective one of the one or more training input data sets, each of the one or more reference output data sets being obtained.

13. The method of claim 12, wherein the one or more sample input data sets includes at least a set of MR data and a set of non-MR data, and wherein the neural network is trained such that neural network is robust to unseen data and is configured to produce the one or more final spatial weighting functions from MR data and non-MR data.

14. The method of claim 12, wherein the one or more training input data sets includes one or more training preliminary spatial weighting functions, and wherein the one or more reference output data sets includes one or more training final spatial weighting functions, each of the one or more training final spatial weighting functions being a previously-obtained artifact-free version of a respective one of the one or more training preliminary spatial weighting functions.

15. The method of claim 14, wherein the neural network is configured to process the one or more training preliminary spatial weighting functions to produce one or more estimated final spatial weighting functions, and wherein the neural network is trained using a cost function configured to minimize differences between the one or more training final spatial weighting functions and the one or more estimated final spatial weighting functions.

16. The method of claim 14, wherein the neural network is configured to process the one or more training preliminary spatial weighting functions to produce one or more estimated final spatial weighting functions, and wherein the neural network is trained using a cost function configured to minimize differences between a training image sequence based on the one or more training final spatial weighting functions and an estimated image sequence based on the one or more estimated final spatial weighting functions.

17. The method of claim 1, wherein the multiplying of the one or more final spatial weighting functions by the one or more temporal basis functions is performed by the neural network.

18. The method of claim 1, further comprising training the neural network prior to inputting the one or more preliminary spatial weighting functions into the neural network to produce the one or more final spatial weighting functions, wherein training the neural network includes:
   receiving one or more training input data sets to the neural network, the one or more training input data sets including one or more sets of training preliminary spatial weighting functions and one or more sets of training final spatial weighting functions, each of the one or more sets of training final spatial weighting functions being a previously-obtained artifact-free version of a respective one of the one or more sets of training preliminary spatial weighting functions, each of the one or more sets of training preliminary spatial weighting functions and training final spatial weighting functions corresponding to at least one time-varying dimension of the subject;
   processing the one or more sets of training preliminary spatial weighting functions according to an architecture of the neural network to produce one or more sets of estimated final spatial weighting functions;
   comparing each of the one or more sets of estimated final spatial weighting functions to a corresponding one of the one or more sets of training final spatial weighting functions;
   determining if a cost function of the neural network is satisfied by the one or more sets of estimated final spatial weighting functions, the cost function configured to minimize differences between the one or more sets of training final spatial weighting functions and the one or more sets of estimated final spatial weighting functions;
   adjusting one or more network weights of the neural network responsive to a determination that the cost function of the neural network is not satisfied; and
   repeatedly processing the one or more training preliminary spatial weighting functions with the adjusted one or more network weights until the cost function is satisfied.

19. A system for performing magnetic resonance (MR) imaging on a subject, comprising:
   a magnet operable to provide a magnetic field;
   a transmitter operable to transmit to a region within the magnetic field;
   a receiver operable to receive a magnetic resonance signal from the region with the magnetic field; and
   one or more processors operable to control the transmitter and the receiver, the one or more processors being configured to cause the following method to be performed:
      obtaining undersampled imaging data from a region of interest of the subject, the undersampled imaging data corresponding to an image sequence having a plurality of image frames;
      extracting one or more temporal basis functions from the undersampled imaging data, each of the one or more temporal basis functions corresponding to at least one time-varying dimension of the subject;
      extracting one or more preliminary spatial weighting functions from the undersampled imaging data, each of the one or more preliminary spatial weighting functions corresponding to a spatially-varying dimension of the subject;
      inputting the one or more preliminary spatial weighting functions into a neural network to produce one or more final spatial weighting functions, each of the final spatial weighting functions corresponding to a respective one of the one or more preliminary spatial weighting functions; and
      multiplying the one or more final spatial weighting functions by the one or more temporal basis functions to generate the image sequence.

20. A non-transitory machine-readable medium having stored thereon instructions for performing magnetic resonance (MR) imaging on a subject, which when executed by at least one processor, cause the following method to be performed:
   obtaining undersampled imaging data from a region of interest of the subject, the undersampled imaging data corresponding to an image sequence having a plurality of image frames;
   extracting one or more temporal basis functions from the undersampled imaging data, each of the one or more temporal basis functions corresponding to at least one time-varying dimension of the subject;
   extracting one or more preliminary spatial weighting functions from the undersampled imaging data, each of the one or more preliminary spatial weighting functions corresponding to a spatially-varying dimension of the subject;
   inputting the one or more preliminary spatial weighting functions into a neural network to produce one or more final spatial weighting functions, each of the final spatial weighting functions corresponding to a respective one of the one or more preliminary spatial weighting functions; and
   multiplying the one or more final spatial weighting functions by the one or more temporal basis functions to generate the image sequence.

* * * * *